United States Patent
Meyer-Berg (10) Patent No.: US 9,917,036 B2
(45) Date of Patent: Mar. 13, 2018

(54) CHIP PACKAGE AND A WAFER LEVEL PACKAGE

(71) Applicant: Infineon Technologies AG, Neubiberg (DE)

(72) Inventor: Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 88 days.

(21) Appl. No.: 14/827,361

(22) Filed: Aug. 17, 2015

(65) Prior Publication Data

US 2016/0190044 A1 Jun. 30, 2016

Related U.S. Application Data

(62) Division of application No. 13/523,942, filed on Jun. 15, 2012, now Pat. No. 9,111,847.

(51) Int. Cl.
*H01L 23/043* (2006.01)
*H01L 23/495* (2006.01)
(Continued)

(52) U.S. Cl.
CPC .... *H01L 23/49513* (2013.01); *H01L 21/4821* (2013.01); *H01L 21/561* (2013.01); *H01L 23/49541* (2013.01); *H01L 23/49575* (2013.01); *H01L 23/49582* (2013.01); *H01L 24/19* (2013.01); *H01L 24/24* (2013.01); *H01L 24/32* (2013.01); *H01L 24/82* (2013.01); *H01L 25/0655* (2013.01); *H01L 23/3128* (2013.01); *H01L 24/13* (2013.01); *H01L 24/20* (2013.01); *H01L 2224/0401* (2013.01); *H01L 2224/04105* (2013.01); *H01L 2224/05548* (2013.01); *H01L 2224/12105* (2013.01); *H01L 2224/13022* (2013.01); *H01L 2224/13024* (2013.01); *H01L 2224/24155* (2013.01); *H01L 2224/2919* (2013.01); *H01L 2224/29082* (2013.01);
(Continued)

(58) Field of Classification Search
CPC ......... H01L 23/49513; H01L 23/49541; H01L 23/49582; H01L 23/645; H01L 23/552; H01L 24/19; H01L 24/32; H01L 24/20
See application file for complete search history.

(56) References Cited

U.S. PATENT DOCUMENTS 7,849,591 B2 12/2010 Okamoto et al.
2001/0052647 A1 12/2001 Plepys et al.
(Continued)

FOREIGN PATENT DOCUMENTS

CN 1137324 A 12/1996
CN 101288351 A 10/2008
(Continued)

*Primary Examiner* — Trung Q Dang
(74) *Attorney, Agent, or Firm* — Viering, Jentschura & Partner MBB (57) ABSTRACT

Various embodiments provide for a chip package consisting of a layer over a carrier, further carrier material over the layer, wherein one or more portions of the further carrier material is removed, and a chip with one or more contact pads, where the chip is adhered to the carrier via the layer. A wafer level package consisting of a plurality of chips adhered to the carrier via a plurality of portions of the layer released from the further carrier material is also provided for.

20 Claims, 10 Drawing Sheets (51) Int. Cl.
- *H01L 21/56* (2006.01)
- *H01L 23/00* (2006.01)
- *H01L 21/48* (2006.01)
- *H01L 25/065* (2006.01)
- *H01L 23/31* (2006.01)

(52) U.S. Cl.
CPC ........ *H01L 2224/29139* (2013.01); *H01L 2224/29144* (2013.01); *H01L 2224/29155* (2013.01); *H01L 2224/29164* (2013.01); *H01L 2224/32245* (2013.01); *H01L 2224/73267* (2013.01); *H01L 2224/82007* (2013.01); *H01L 2924/01028* (2013.01); *H01L 2924/01046* (2013.01); *H01L 2924/01047* (2013.01); *H01L 2924/01079* (2013.01); *H01L 2924/06* (2013.01); *H01L 2924/0665* (2013.01); *H01L 2924/07025* (2013.01); *H01L 2924/07802* (2013.01); *H01L 2924/12042* (2013.01); *H01L 2924/1715* (2013.01); *H01L 2924/1776* (2013.01); *H01L 2924/17738* (2013.01); *H01L 2924/17747* (2013.01); *H01L 2924/17763* (2013.01); *H01L 2924/181* (2013.01); *H01L 2924/2064* (2013.01); *H01L 2924/2065* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01); *H01L 2924/20646* (2013.01); *H01L 2924/20647* (2013.01); *H01L 2924/20648* (2013.01); *H01L 2924/20649* (2013.01)

(56) References Cited

U.S. PATENT DOCUMENTS

| | | | |
|---|---|---|---|
| 2006/0145331 A1* | 7/2006 | Cho | H01L 24/18 257/700 |
| 2009/0154132 A1 | 6/2009 | Okamoto et al. | |
| 2009/0242107 A1 | 10/2009 | Sunohara et al. | |
| 2011/0241195 A1* | 10/2011 | Nalla | H01L 21/568 257/690 |

FOREIGN PATENT DOCUMENTS

| | | |
|---|---|---|
| KR | 20090032225 A | 4/2009 |
| KR | 20100047540 A | 5/2010 |
| WO | 9516998 A1 | 6/1995 |

* cited by examiner

CHIP PACKAGE AND A WAFER LEVEL PACKAGE

CROSS-REFERENCE TO RELATED APPLICATIONS

This is a divisional of application Ser. No. 13/523,942, filed on Jun. 15, 2012, which is hereby incorporated herein by reference in its entirety.

TECHNICAL FIELD

Various embodiments relate generally to a method for manufacturing a chip package, a method for manufacturing a wafer level package, a chip package and a wafer level package.

BACKGROUND

Chips may be arranged regularly together in panel form or wafer form, e.g. in a reconstituted wafer form, in a chip package formation such as in embedded wafer level ball grid array (eWLB). A metal layer, which may be designated as a redistribution layer (RDL), may serve as an electrical connection to external connection pads. An embedded wafer level package, e.g. embedded wafer level ball grid array (eWLB) may have several associated problems, significant parts of which may be attributed to the mold compound. Problems may include warpage, deformation, e.g. x-y deformation, outgassing from the material, problems with the temperature cycling on board (TCoB) cycling durability, poor thermal conductivity, and difficulties associated with contacts, e.g. backside of the ICs leads to contact.

SUMMARY

Various embodiments provide a method for manufacturing a chip package, the method including forming a layer over a carrier; forming further carrier material over the layer; selectively removing one or more portions of the further carrier material thereby releasing one or more portions of the layer from the further carrier material; and adhering a chip including one or more contact pads to the carrier via the layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide a method for carrying out reconstitution of a wafer and/or panel.

Various embodiments provide an embedded wafer level package which may not require a mold compound.

Various embodiments provide a reconstituted wafer, wherein integrated circuit chips may be arranged precise and/or elastically and/or planarly in cavities of a metal sheet and/or foil and/or plate.

Various embodiments provide an embedded wafer level package which may include a metal sheet and/or metal foil and/or metal plate, e.g. including copper and/or stainless steel, in which cavities may be structured in the metal sheet and/or foil and/or plate, wherein the cavities may be slightly larger than the integrated circuit (IC) chips to be mounted. The metal sheet and/or metal foil and/or metal plate may be structured by etching or sandblasting, and cavities which result from the structuring may be at least partially filled with glue, e.g. conductive glue, a solder material or a paste.

According to various embodiments, an etch stop layer may be used to precisely form the cavities in the metal sheet and/or metal foil and/or metal plate, and the etch stop layer may also be used as an adhesion for adhering the IC chips to the metal sheet and/or metal foil and/or metal plate.

Figure 1:
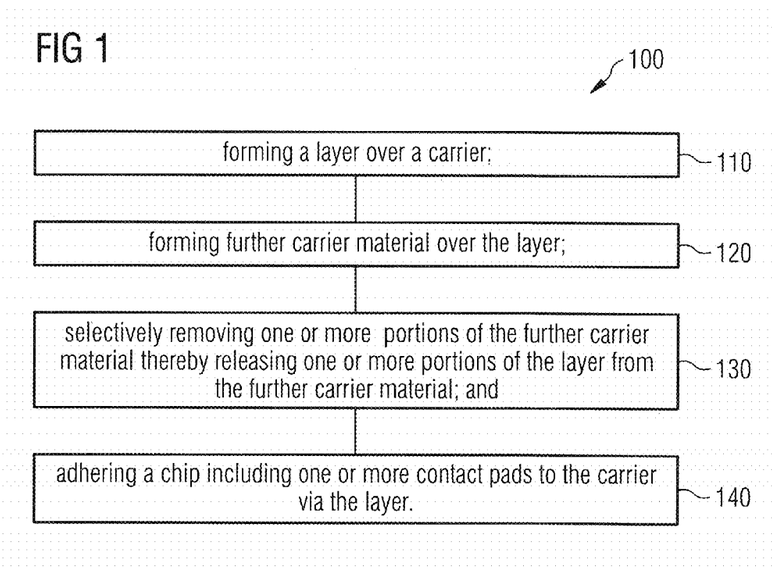
FIG. 1 shows a method for manufacturing a chip package according to an embodiment.

FIG. 1 shows method 100 for manufacturing a chip package according to an embodiment. Method 100 may include:

forming a layer over a carrier (in 110);

forming further carrier material over the layer (in 120);

selectively removing one or more portions of the further carrier material thereby releasing one or more portions of the layer from the further carrier material (in 130); and adhering a chip including one or more contact pads to the carrier via the layer (in 140).

FIGS. 2A to 2G show method 200 for manufacturing a chip package according to an embodiment.

Figure 2A:
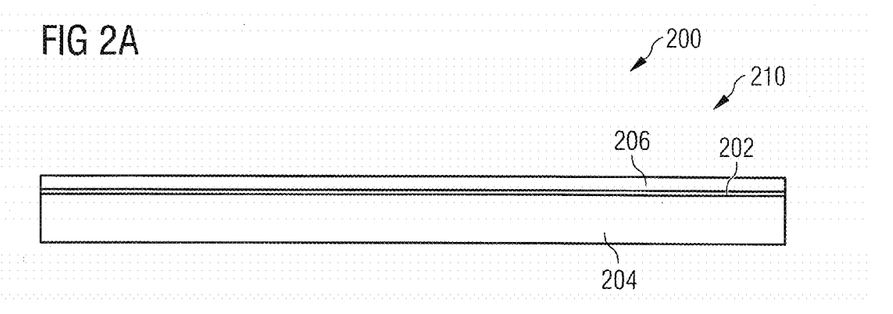
FIGS. 2A to 2G show a method for manufacturing a chip package according to an embodiment.

Method 200 may include forming layer 202 over carrier 204 as shown in 210 of FIG. 2A. Carrier 204 may include an electrically conductive sheet. Carrier 204 may include an electrically conductive foil. Carrier 204 may include an electrically conductive plate. Carrier 204 may include a metal. Carrier 204 may include at least one material from the following group of materials, the group consisting of: copper, nickel, iron, silver, gold, palladium, copper alloy, nickel alloy, iron alloy, silver alloy, gold alloy, palladium alloy. For example, carrier 204 may include CuFe2P, e.g. carrier 204 may include CuFe01P. Carrier 204 may include a leadframe material. Carrier 204 may include stainless steel. Carrier 204 may include a thickness ranging from about 50 μm to about 1000 μm, e.g. about 100 μm to about 800 μm e.g. about 100 μm to about 300 μm. Carrier 204 may include, but is not limited to including, the following dimensions. Carrier 204, if in circular or round form, may have a diameter of e.g. about 200 mm, or about 300 mm, or about 450 mm. Carrier 204, if in rectangular or square form, may have a length× breadth, for example of 200 mm×200 mm, or 300 mm×450 mm, or 450×600 mm. These dimensions of the carrier may depend on the equipment.

Layer 202 may be formed over carrier 204 and further carrier material 206 may be formed over layer 202. Layer 202 may function as an etch stop layer, e.g. a protective layer for carrier 204 during etching of further carrier material 206. Layer 202 may further function as an adhesion layer to adhere further carrier material 206 to carrier 204. Furthermore, layer 202, in addition to functioning as an etch stop layer, and as an adhesion layer between further carrier material 206 and carrier 204, may also function as a support for a die attach material, which adheres chip to carrier 204. Therefore, it may be understood that layer 202, described herein may not only include a single layer, and may according to various other embodiments include more than one layer, e.g. a multi-layer arrangement, in order to fulfill the functions described above.

Layer 202 (single layer or multi-layer) may function as part of an adhesion for adhering further carrier material 206 to carrier 204, as an etch stop protective layer for carrier 204, and eventually as an adhesion for a chip to carrier 204. Layer 202 according to various embodiments is shown in FIGS. 8A to 8E and will be described further in detail below.

Layer 202 may include a thickness ranging from about 1 μm to about 50 μm, e.g. about 10 μm to about 40 μm, e.g. about 15 μm to about 35 μm. It may be understood that these thicknesses may depend on the material of layer 202 and the deposition methods used to deposit layer 202. Further, these thicknesses may depend on roughness of carrier 204. These thicknesses may be described further below. Layer 202 may have as far as possible a uniform thickness.

Generally, layer 202 may be deposited by at least one method from the following group of methods, the group of methods consisting of: electroplating, electroless plating, galvanic deposition, lamination, foil lamination, sputtering, evaporation, chemical vapor deposition, plasma enhanced chemical vapor deposition, spin-coating, spraying. These methods may be selectively used for deposition of single layer 202 or for multi-layers of layer 202.

Depending on whether an electrically conductive connection is required between a chip back side (shown later) and carrier 204, materials for layer 202 may be chosen accordingly. For example, according to various embodiments, layer 202 may include an electrically conductive material. According to other embodiments, layer 202 may include an electrically insulating material, e.g. an electrically insulating layer. It may be understood that a logic chip may allow for either an electrically insulating die attach or an electrically conductive die attach, whereas a power semiconductor chip with electrical backside contact may only allow for an electrically conductive die attach. Therefore, if chip 218 includes a logic chip, then in addition to the functions described above, layer 202 may provide an electrical insulation or an electrical path between the chip adhered side and carrier 204. If chip 218 includes a power semiconductor chip, then an electrically conductive connection between a side of chip 218 adhered to carrier 204 and carrier 204 may be required by layer 202. Therefore, layer 202 may be selected and/or processed according to the requirements of the chip package.

Figure 8A:
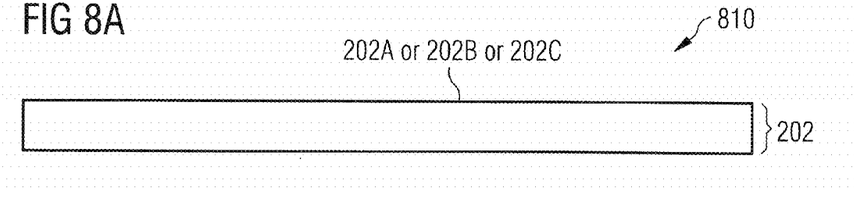
FIGS. 8A to 8D shows a method for manufacturing a chip package according to an embodiment.

FIG. 8A shows part layer 202 arrangement according to various embodiments.

According to an embodiment, layer 202 may include a single electrically conductive layer. Layer 202 may include, for example, a single solder layer 202A, which may be deposited for example by galvanic deposition. Layer 202 as a solder layer 202A may function as soldering attach layer between further carrier material 206 and carrier 204. In subsequent processes, solder layer 202A may function as an etch stop layer. It may be understood that after etching, intermetallic phases, which may be unsuitable for re-melting, e.g. Cu—Sn interfaces, may be formed on solder layer 202A, and an adhesive layer (described later) may be deposited subsequently to provide an attachment, e.g. by adhesion or sintering, between a chip and carrier 204.

According to another embodiment, instead of a solder layer 202A, layer 202 may include a single layer of electrically conductive glue 202B. Electrically conductive glue 202B may function as an adhesion layer between further carrier material 206 and carrier 204, and further as an etch stop layer. After etching, an additional adhesive layer may optionally be required for adhering a chip to carrier 204 via single layer 202B.

According to another embodiment, layer 202 may include single layer 202C. As an example, layer 202C may include nanopaste, e.g. a silver nanopaste, which may function as a sintering attachment layer between further carrier material 206 and carrier 204, and further as an etch stop. Sintering layer 202C may need to be further processes later, or subsequent processes may need to be carried out to ensure that a chip may be adhered to carrier 204 via single sintering layer 202C. Such further processes may include formation of an adhesion layer, e.g. comprising electrically conductive glue or solder, or electrically conductive paste, over sintering layer 202C.

Figure 8B:
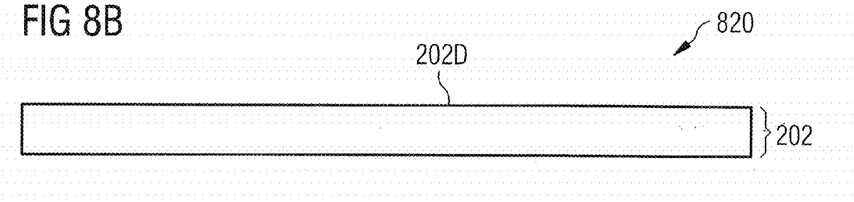

FIG. 8B shows layer 202 arrangements according to various embodiments. According to an embodiment, layer 202 may include an electrically insulating glue 202D. Electrically insulating glue layer 202D may include an electrically insulating material, e.g. including at least one material from the following group of materials, the group consisting of: polyimide, benzocyclobuten (BCB), epoxy. Electrically insulating glue layer 202D may be formed over carrier 204 by at least one method from the following group of methods, the group of methods consisting of: spin coating, spraying, printing, lamination.

Electrically insulating glue layer 202D may function as at least one of an etch stop layer, an adhesion for adhering further carrier material 206 to carrier 204, and further as a die attach for adhering a chip to carrier 204.

In particular, polyimide may fulfill all three functions, by curing, e.g. for adhering further carrier material 206 to carrier 204, as an etch stop, and then reheating, e.g. for adhering a chip to carrier 204.

Figure 8C:
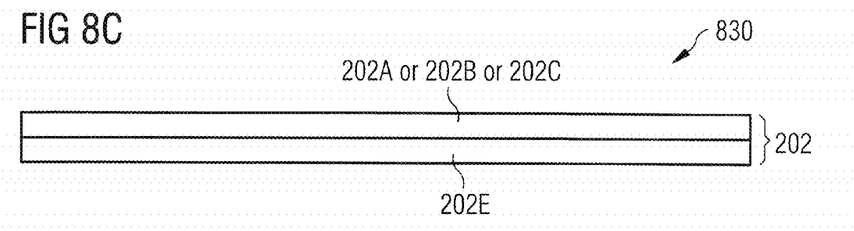
Figure 8D:
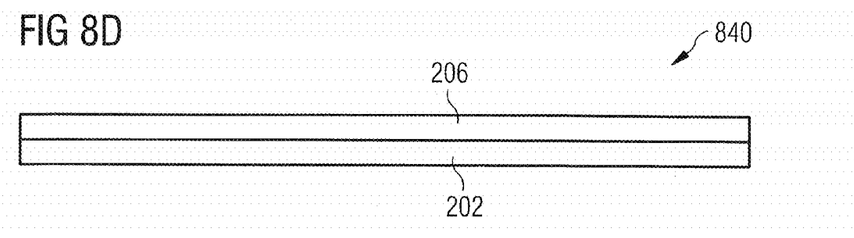

FIG. 8C shows part of a chip package according to an embodiment. According to various other embodiments, layer 202 may include a multi-layer. According to the embodiment, an optional electrically conductive layer 202E may be formed between carrier 204 and at least one of layers 202A, 202B or 202C.

It may be understood that according to various embodiments, the different types of layers 202A, 202B, 202C, 202D may be combined, or used individually or in combination with other layers, to form layer 202 arrangement which may serve the functions of an adhesion layer between further carrier material 206 and carrier 204, as an etch stop layer for carrier 204 and as an adhesive between a chip and carrier 204.

In reference further to process 210, after deposition of layer 202 over carrier 204 according to a process described with respect to at least one of FIGS. 8A to 8D, further carrier material 206 may be formed over layer 202.

Further carrier material 206 may include a thickness ranging from about 60 μm to about 200 μm, e.g. about 80 μm to about 180 μm, e.g. about 100 μm to about 150 μm. Further carrier material 206 may include the same material or different material as carrier 204.

Generally, further carrier material 206 may be deposited by at least one method from the following group of methods, the group of methods consisting of: lamination, sintering, gluing or printing. Layer 202 materials may be taken into account when selecting a deposition method for further carrier material 206.

According to various embodiments, further carrier material 206, may include a layer, e.g. a foil, such as a copper foil, which may be laminated and/or sintered to layer 202.

For example, if layer 202 includes as a top-most layer, layer 202C which includes a nanopaste, such as silver nanopaste, then further carrier material 206 may be sintered to sintering layer 202C of layer 202.

According to another embodiment, for example, if layer 202 includes as a top-most layer, layer 202B or layer 202D which includes glue, then further carrier material 206 may be adhered, e.g. glued, to carrier 204 by a glue, e.g. via electrically insulating glue layer 202D or electrically conductive glue 202B of layer 202.

According to an embodiment, for example, if layer 202 includes as a top-most layer solder layer 202A, further carrier material 206 may be soldered to carrier 204 by a solder layer, e.g. solder layer 202A of layer 202.

According to various embodiments, it may even be possible that instead of forming layer 202 and further carrier material 206 in separate processes, layer 202 and further carrier material 206 may be formed together over carrier 204. For example, layer 202 and further carrier material 206 may form part of a single foil, e.g. a resin coated copper (RCC) foil, which may be adhered, e.g. laminated, to carrier 204. The foil may include the resin, which includes an electrically insulating layer and copper coating, i.e. 206. In which case, layer 202 together with further carrier material 206 may be formed simultaneously over carrier 204 by foil lamination (See FIG. 8D).

According to various embodiments, it may even be possible that layer 202 may be deposited over further carrier material 206, for example, according to similar methods as described in process 210, before forming layer 202 and further carrier material 206 over carrier.

According to various other embodiments, further carrier material 206 may be joined or adhered to carrier 204 by a roll-to-roll process, particularly where high volumes are required. A portion of a roll of further carrier material 206 may be joined to a further portion of a roll of carrier 204 via layer 202, which may be deposited, e.g. via spraying, between carrier 204 and further carrier material 206.

According to various embodiments, it may even be possible that layer 202 may be deposited over further carrier material 206, for example, according to similar methods as described in process 210, before forming layer 202 and further carrier material 206 over carrier.

Figure 2B:
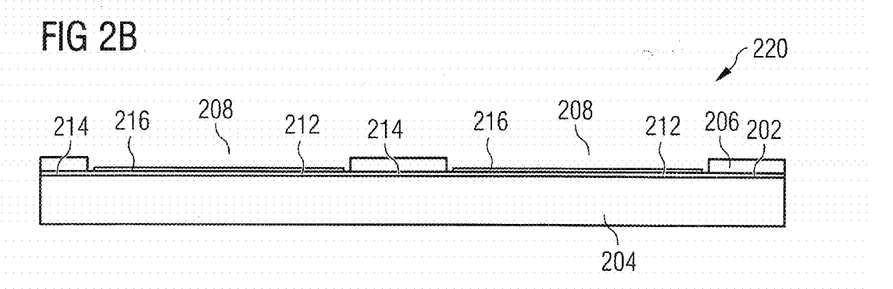

Method 200 may include selectively removing one or more portions 208 of further carrier material 206 thereby releasing one or more portions 212 of layer 202 from further carrier material 206 as shown in 220 of FIG. 2B. One or more portions 208 of further carrier material 206 may be selectively etched, wherein layer 202, which may include at least one of layers 202A, 202B, 202C, 202D, 202E, may function as an etch stop layer. In other words, layer 202 may prevent etching of carrier 204, i.e. may protect carrier 204 from being etched, by being selectively resistant to the etchant used for etching further carrier material 206. One or more portions 208 of further carrier material 206 may be selectively removed by at least one method from the following group of methods, the group of methods consisting of: chemical etching, sandblasting. Sandblasting in particular may used when layer 202 includes a glue. In other words, layer 202 may be resistant to these methods for selectively removing one or more portions 208.

One or more portions 212 of layer 202 released from further carrier material 206 may be commonly joined by further portions 214 of layer 202 covered by further carrier material 206. In other words, further portions 214 may be covered by portions of further carrier material 206 not removed by the selective removal process. The removed one or more portions 208 may be slightly larger than the size of the chips 218 to be placed within the one or more portions 208. It may be understood that the removal of one or more portions 208 may be referred to as a formation of one or more cavities 208 in the stacked carrier 204-layer 202-further carrier material 206 arrangement.

Figure 9:
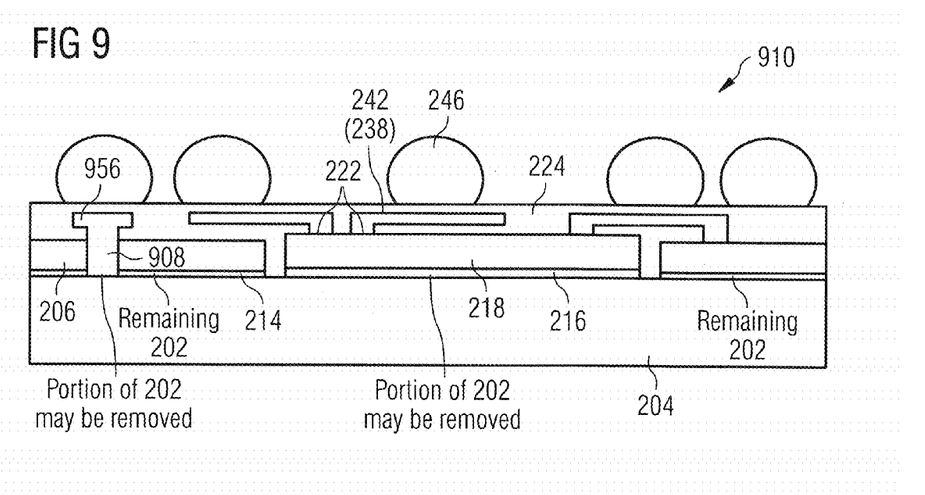
FIG. 9 shows a chip package according to an embodiment.

It may be understood that in addition to one or more cavities 208 being formed, other holes 908 may also be formed in further carrier material 206 during the etching process (See FIG. 9). Holes 908 may be smaller than cavities 208 and may be used for forming an electrical connection 956 in hole 908 through further carrier material 206 to carrier 204.

Following etching, intermediate processes may be carried out on released one or more portions 212 of layer 202 if required, to adhere a chip to carrier via layer 202. Depending on layer 202 and on etching materials, released one or more portions 212 of layer 202, may or may not be able to function as a chip adhesion material after etching.

In the case that layer 202 may not be able to function as a chip adhesion material, adhesion layer 216 may be formed over layer 202. In other cases, portions of layer 202 may be removed. For example, if layer 202 includes a single layer e.g. a polyimide foil 202D, it may be the case that portions of layer 202D may be removed. Optionally, as shown in FIG. 9, portions of layer 202D which may be exposed by the formation of cavity 208 may be removed, and furthermore, portions of layer 202D exposed by the formation of hole 908 may also be removed. The removal may be carried out, e.g. using back-sputtering if layer 202D is thin or e.g. lasering. Subsequently, an adhesion layer 216, e.g. electrically conductive glue or solder or nanopaste, may be formed over carrier 204 in cavity 208, for example by printing. Later on, further electrically conductive material 956 may be formed in hole 908 to form an electrical connection 956 through further carrier material 206 to carrier 204. It may be understood that through etching, besides removing one or more portions of further carrier material 206, it may also be possible to selectively remove one or more portions of carrier 204. In other words, one or more portions of at least one of carrier 204 and further carrier material 206 may be selectively removed. It may be understood that at least one of carrier 204 and further carrier material 206 may even be structured such that at least one may include an electrically conductive redistribution layer, for example if layer 202 includes an electrically insulating layer.

Adhesion 216 may be an electrically conductive glue and/or solder material and may be deposited in cavities 208. Adhesion layer 216 may be selected such that a chip 218 may be adhered to carrier 204 via layer 202 and adhesion layer 216.

Chip 218 may be adhered to carrier 204 by a range of methods, e.g. soldering, diffusion soldering or adhesive bonding.

For soldering, e.g. diffusion soldering, adhesion layer 216 may include a solder material including at least one material from the following group of materials, the group consisting of: silver, silver alloy, lead, copper, tin, tin alloy.

If adhesive bonding is used, adhesion layer 216 may include an electrically conductive material, e.g. an electrically conductive adhesive. Adhesion layer 216 may include for example, epoxies, polymers with electrically conductive particles, e.g. gold, silver, copper particles. For example, adhesion layer 216 may include an electrically conductive material including at least one material from the following group of materials, the group consisting of: an electrically conductive glue, an electrically conductive adhesive, an electrically conductive polymer, an electrically conductive organic polymer, an electrically conductive epoxy. Furthermore, adhesion layer 216 may be screen printed onto layer 202.

For a non-electrically conductive adhesion, adhesion layer 216 may include an electrically insulating material, e.g. an adhesive, e.g. a glue, including at least one material from the following group of materials, the group consisting of: a polymer, an organic polymer, epoxy. If layer 202 already includes electrically insulating material 202C, e.g. durimide polyimide, e.g. benzocyclobuten, then adhesion layer 216 may not be necessary, as electrically insulating material 202C may be used both as an etch stop as well as an adhesive glue between the chip and carrier 204.

Adhesion layer 216 may be formed over one or more portions 212 of layer 202 released from further carrier material 206, i.e. within one or more cavities 208 of the stacked carrier 204-layer 202-further carrier material 206 arrangement. Challenges of print in cavities may be overcome by printing developments and sliced squeegees. Adhesion layer 216 may not be limited to having a particular thickness, but according to various embodiments may have a thickness ranging from about 3 μm to about 70 μm, e.g. about 15 μm to about 60 μm, e.g. about 20 μm to about 40 μm. Adhesion layer 216 may be deposited over by at least one method from the following group of methods, the group of methods consisting of: printing or foil attach or ink jetting or dispensing. Adhesion layer 216 may be formed over one or more portions 212 of layer 202 released from further carrier material 208, and chip 218 may be adhered to carrier 204 via adhesion layer 216.

Figure 2C:
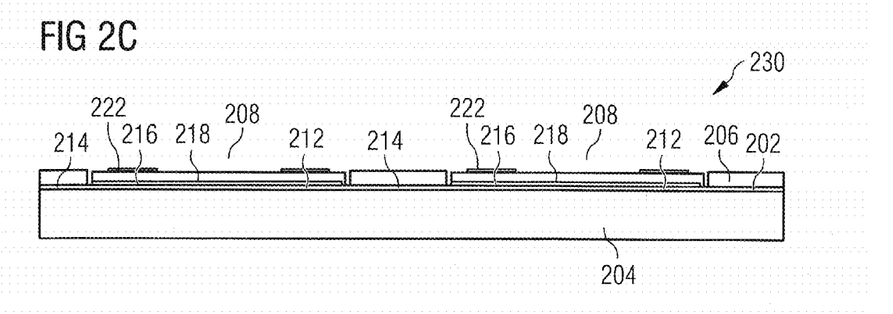

In 230 of FIG. 2C, chip attachment may be carried out. Chip attachment may be carried out by adhesion, e.g. gluing, soldering. Chip 218 including one or more contact pads 222 may be adhered to carrier 204 via layer 202, e.g. to one or more portions 212 of layer 202 released from further carrier material 202. It may be understood that chip 218 may be adhered to carrier 204 via adhesion layer 216. For example adhesion layer 216 may adhere chip 218 to layer 202 which may be formed over carrier 204 and adhered to carrier 204. According to other embodiments, adhesion layer 216 may be formed, e.g. deposited, over a side of chip 218 (referred to as the adhered side) to be adhered to layer 202, instead of or in addition to being deposited over one or more portions 212. The adhered side may include the back side of chip 218 or front side of chip 218. FIG. 2C particularly shows that the adhered side may include the back side of chip 218, and one or more contacts pads 222 may be formed over the front side of chip 218. According to other embodiments, layer 202, e.g. layer 202C, polyimide, may be the adhesion layer 216 which adheres chip 218 to layer 202.

Chip 218 may not be limited to having a particular thickness, however, various embodiments may include chip 218 having a thickness ranging from about 20 μm to about 250 μm, e.g. about 50 μm to about 150 μm, e.g. about 60 μm to about 100 μm. IC chip 218 to be mounted may alternatively, or additionally, carry on their back side, a die attach film or foil (adhesion layer 216), which may be brought on in advance to a wafer, e.g. a silicon wafer including the IC chips. The larger the IC chips and stronger the metal foil (adhesion 216), the more important it is to utilize a glue, e.g. an adhesive, which may have a smaller Young's modulus (E) e.g. 3 MPA. If it is a priority to have higher current density, a solder method, e.g. diffusions solder method, or a nano-paste may be used instead of gluing. Therefore, the electrically conducting foil may be newly arranged after the solder process, and the chips may be centrally adjusted in the free space, i.e. the cavity.

Figure 2D:
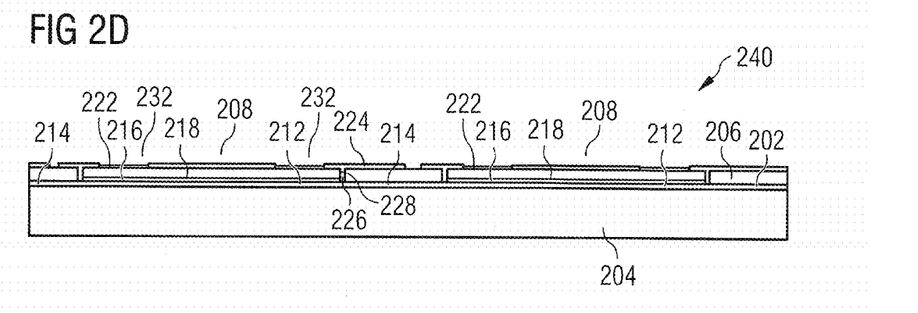

Method 200 may further include depositing passivation material 224 over carrier 204 and chip 218 as shown in 240 of FIG. 2D. Passivation material 224 may be formed over layer 202 and/or over further portions 214 of layer 202. Passivation material 224 may be formed over further carrier material 206. Passivation material 224 may be formed over a side which faces a direction opposite to the direction the adhered side faces, e.g. over the front side of chip 218. Passivation material 224 may be formed over one or more contact pads 222. Passivation material 224 may be formed over one or more sidewalls 226 of chip 218, wherein one or more sidewalls 226 are arranged between chip front side and chip back side, for example, one or more sidewalls 226 may connect chip front side and chip back side. Passivation material 224 may be formed between one or more sidewalls 226 of chip 218 and one or more sidewalls 228 of further carrier material 206. Passivation material 224 may not be limited to having a particular thickness, but according to various embodiments may have a thickness ranging from about 10 μm to about 20 μm. Passivation material 224 may include at least one material from the following group of materials, the group consisting of: polyimide, epoxy, polymers. Passivation material 224 may be deposited by imide-processing techniques, e.g. spin coat, e.g. foil lamination, e.g. spray coating. Imide, e.g. polyimide, processing may include die embedding (lasting approximately 5 seconds), for the package, to enforce high voltage isolation. A die attach tool may be used for height control by cavity edge. Embedded wafer level ball grid array (eWLB) processing may be carried out, for example, ball array (BA) or land grid array (LGA) finishing may be carried out. In other words, the reconstituted wafer may be finished with, e.g. a photo-sensitive polyimide, and carrier 204, IC chip 218 and the gaps around the IC chip 218 may be filled with the polyimide. Alternatively a photo-structureable or laser structureable permanent foil may be used.

Figure 7:
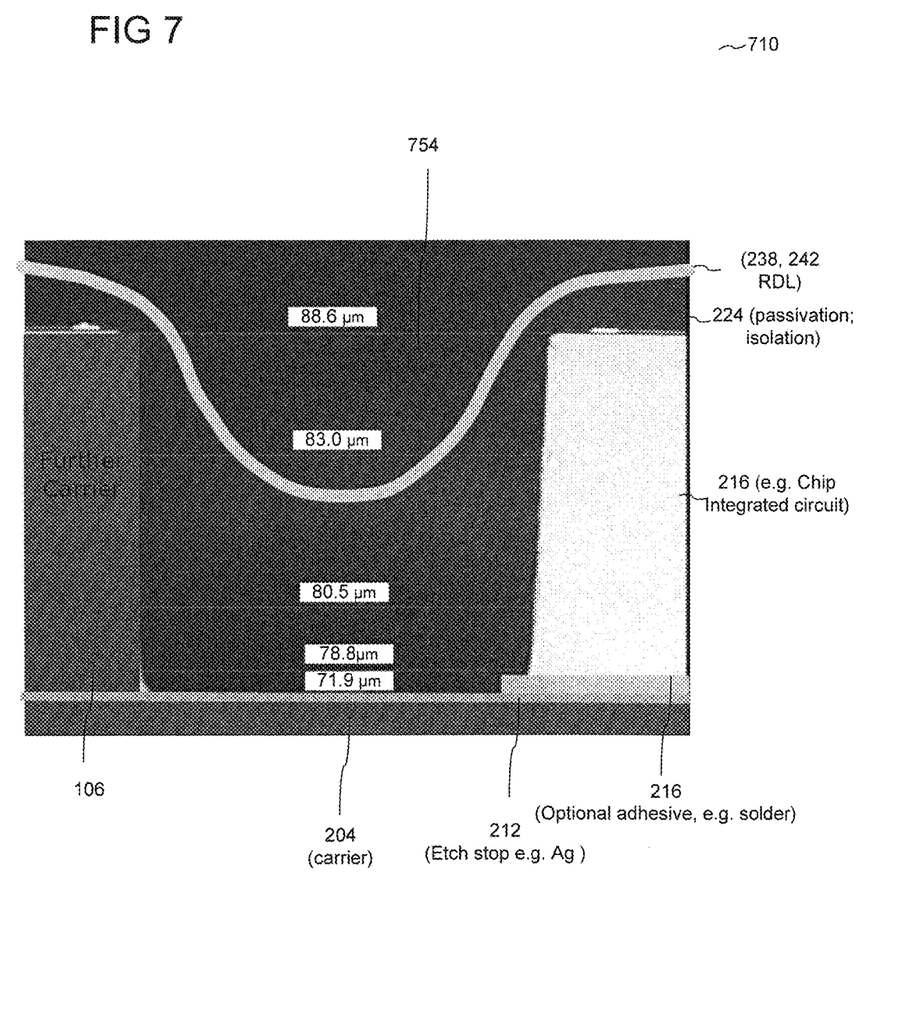
FIG. 7 shows a method for manufacturing a chip package according to an embodiment.

Method 200 may further include selectively removing one or more portions 232 of passivation material 224 thereby releasing the one or more contact pads 222 from passivation material 224 as shown in 240. One or more portions 232 of passivation material 224 may be selectively removed by at least one method from the following group of methods, the group of methods consisting of: chemical etching, plasma etching, laser structuring, photostructuring. It may be understood that one or more portions 232 may be portions of passivation material 224 formed over, e.g. indirectly on or directly on, one or more contact pads 222. Therefore, passivation material 224 may electrically insulate chip 218 from carrier 204, adhesion layer 216, layer 202 and further carrier material 206. As shown in FIG. 7, passivation material 224 may include polyimide which may be used for gap filling, for example to fill gaps 754 between one or more sidewalls 226 of chip 218 and one or more sidewalls 228 of further carrier material 206. Gaps 754 are not particularly limited to having a particular width or height, however according to various embodiments, gaps 754 may have a width ranging from about 30 µm to about 100 µm, e.g. 50 µm to about 80 µm.

Figure 2E:
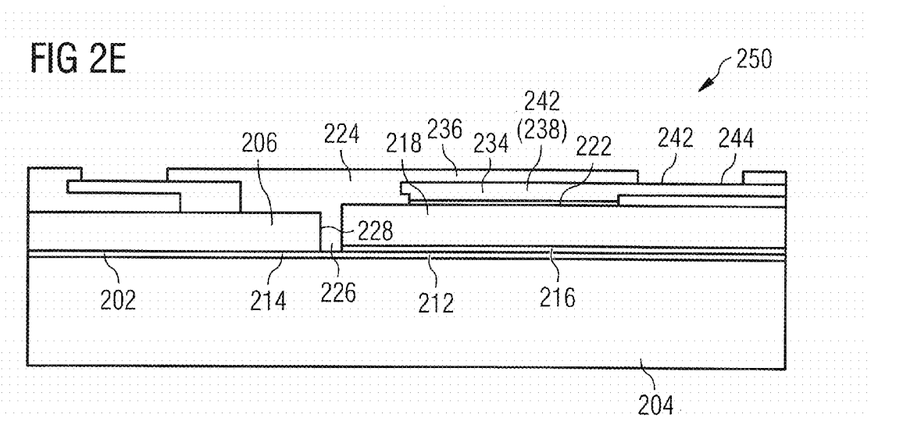

After exposure and development, vias to IC chip 218 and possibly vias to carrier 204 may be freed, e.g. formed. Redistribution lines (RDL) 238, 242 may be deposited, e.g. in the vias, like in eWLB, wherein polyimide or other passivation materials 224, may serve as a solder mask. Subsequently, the wafer level package, e.g. the wafer level ball grid array (WLB) may be provided with solder balls according to design, or as land grid array (LGA). This is shown in 250, wherein electrically conductive material 234 may be formed over passivation material 224 and over one or more contact pads 222, for example in one or more portions 232. In other words, electrically conductive material 234 may be formed over the exposed one or more contact pads 222. Electrically conductive material 234 may include at least one material from the following group of materials, the group consisting of: copper, nickel, iron, silver, gold, palladium, copper alloy, nickel alloy, iron alloy, silver alloy, gold alloy, palladium alloy. Electrically conductive material 234 may be referred to as a redistribution layer and/or as an electrical interconnect. Additionally, 240 and 250 may be repeated, e.g. further passivation material 236 may be formed over passivation material 224, one or more portions 238 of further passivation material 236 may be selectively removed, and further electrically conductive material 242 may be formed in the one or more selectively removed portions 238 of further passivation material 236, wherein further electrically conductive material 242 (further redistribution layers) may be in electrical connection with electrically conductive material 234. Any number of redistribution layers 238, 242 may be formed over chip 218 as required, and processes 240 and 250 may be repeated as many times as necessary to achieve the necessary number of redistribution layers. A final passivation layer, e.g. 224 or 236 may be formed over the whole package, including chip 218. The final passivation layer serving as a solder mask. One or more portions 244 of electrically conductive material, e.g. 234 or 242 may be exposed. These portions of electrically conductive material may be in electrical connection with one or more contact pads 222, and may be redistributed, e.g. relocated, from the original location of one or more contact pads 222, e.g. in a fan-in or fan-out configuration. As shown in FIG. 2G, according to various embodiments, redistribution lines 238, 242 may be formed such that at least one redistribution line 238,242 may be arranged outwardly away from the chip, to contact a contact pad 222 to a joining material 246 away from the chip. Furthermore, at least one redistribution line 238, 242 may be arranged inwardly, e.g. to contact another contact pad 222 to a joining material 246 over the chip. Furthermore, redistribution lines 238, 242 may be formed to provide a ground distribution, e.g. between a further contact pad 222 and carrier 204.

Figure 2F:
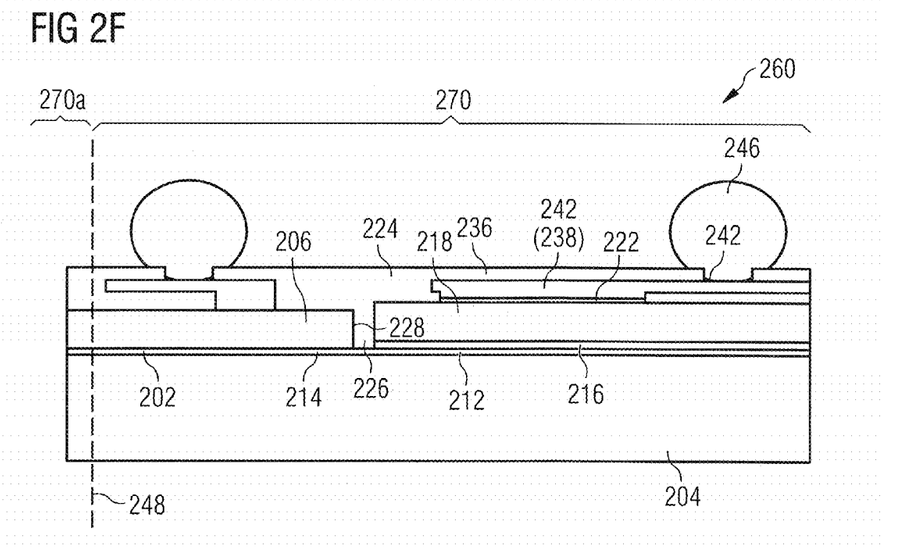
Figure 2G:
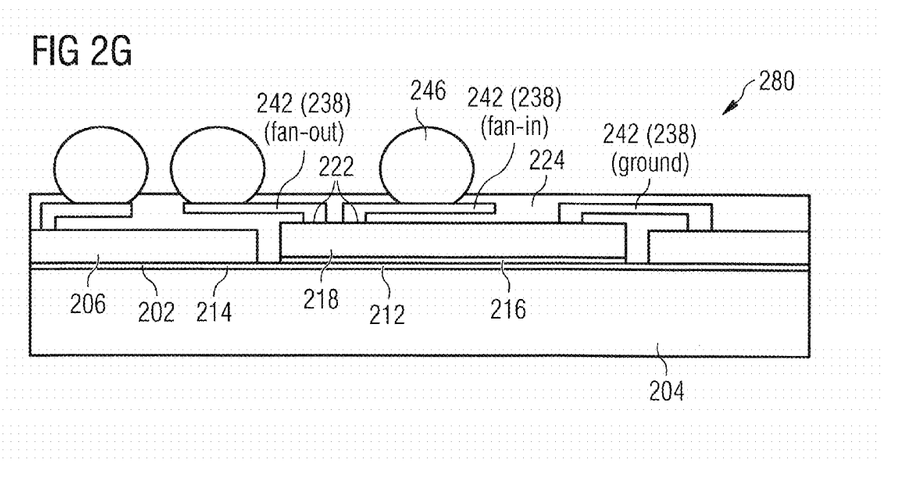

As shown in FIG. 2F, joining material 246 may be added to the exposed one or more portions 244 of electrically conductive material, e.g. 234 or 242. Joining material 246 may include at least one from the following group of joining structures, the group consisting of: solder balls and solder bumps. Joining material 246 may include a solder ball grid array. Joining material 246 may include a solder material from at least one from the following group of materials, the group consisting of: silver, lead, zinc, tin, and/or one or more alloys thereof.

Without adding any mold material, the arrangement may be individualized (separating through dicing line 248) to separate each chip package 270 from neighboring chip packages, e.g. 270a. Method 200 may include individualizing chip package 270 by separating through carrier 204, further carrier material 206 and layer 202. Chip package 270 may be individualized by separating, e.g. dicing, through carrier 204, further carrier material 206, passivation material, e.g. 224, e.g. 236, and layer 202.

According to various embodiments, chip package 270, 280 may include: carrier 204; layer 202 formed over carrier 204; further carrier material 206 formed over layer 202; one or more portions 212 of layer 202 released from further carrier material 206; and chip 218 including one or more contact pads 222, wherein chip 218 is adhered to carrier 204 via layer 202.

Figure 3:
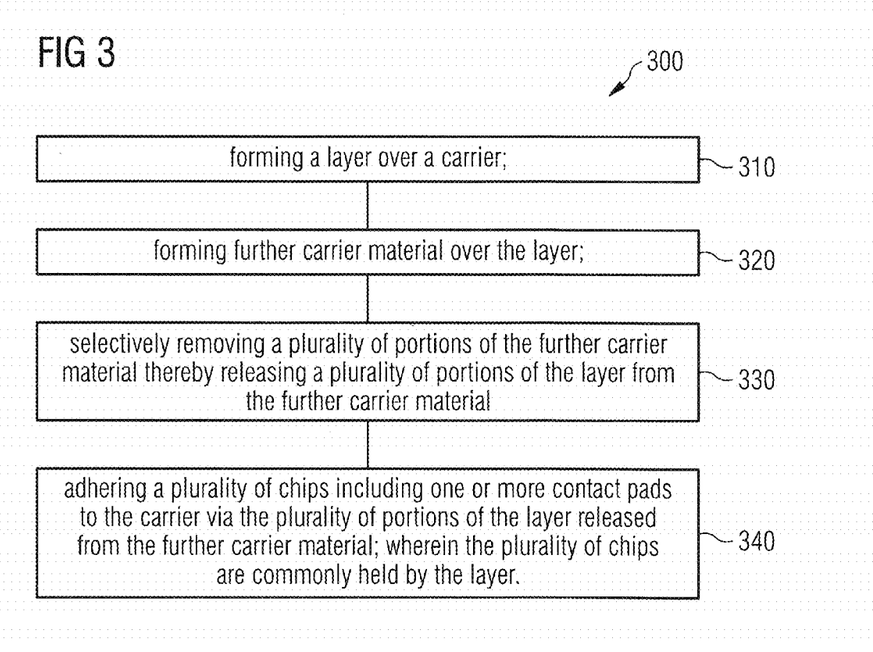
FIG. 3 shows a method for manufacturing a wafer level package according to an embodiment.

FIG. 3 shows method 300 for manufacturing a wafer level package. Method 300 may include forming a layer over a carrier (in 310);

forming further carrier material over the layer (in 320);

selectively removing a plurality of portions of the further carrier material thereby releasing a plurality of portions of the layer from the further carrier material (in 330); and adhering a plurality of chips including one or more contact pads to the carrier via the plurality of portions of the layer released from the further carrier material; wherein the plurality of chips are commonly held by the layer (in 340).

Method 300 may include one or more or all of the features already described with respect to method 200. According to an embodiment, Method 300 may include a method for manufacturing a wafer level package (for example, as shown in FIG. 2C), the method including:

forming layer 202 over carrier 204; forming further carrier material 206 over layer 202; selectively removing a plurality of portions 208 of further carrier material 206 thereby releasing a plurality of portions 212 of layer 202 from further carrier material 206; adhering a plurality of chips 218 including one or more contact pads 222 to carrier 204 via plurality of portions 212 of layer 202 released from further carrier material 206; wherein plurality of chips 218 are commonly held by layer 202. To be commonly held may be understood to mean that the plurality of chips 218 may be arranged over the same continuous layer 202. A wafer level package may be understood to include a plurality of chips held in the form of a reconstituted wafer. While traditionally a reconstituted wafer may include a plurality of chips embedded in mold material, a wafer level package according to various embodiments may include holding the plurality of chips within carrier 202 and/or further carrier material 206, without mold material. In other words, a chip package and a wafer level package according to various embodiments may not require a mold material as with conventional chip packages.

Various embodiments provide a wafer level package (as shown in FIG. 2C) including carrier 204; layer 202 formed over carrier 204; further carrier material 206 formed over layer 202; plurality of portions 212 of layer 202 released from further carrier material 206; plurality of chips 218 each including one or more contact pads 222, wherein plurality of chips 218 are adhered to carrier 204 via plurality of portions 212 of layer 202 released from further carrier material 206; wherein plurality of chips 218 are commonly held by layer 202.

Figure 4:
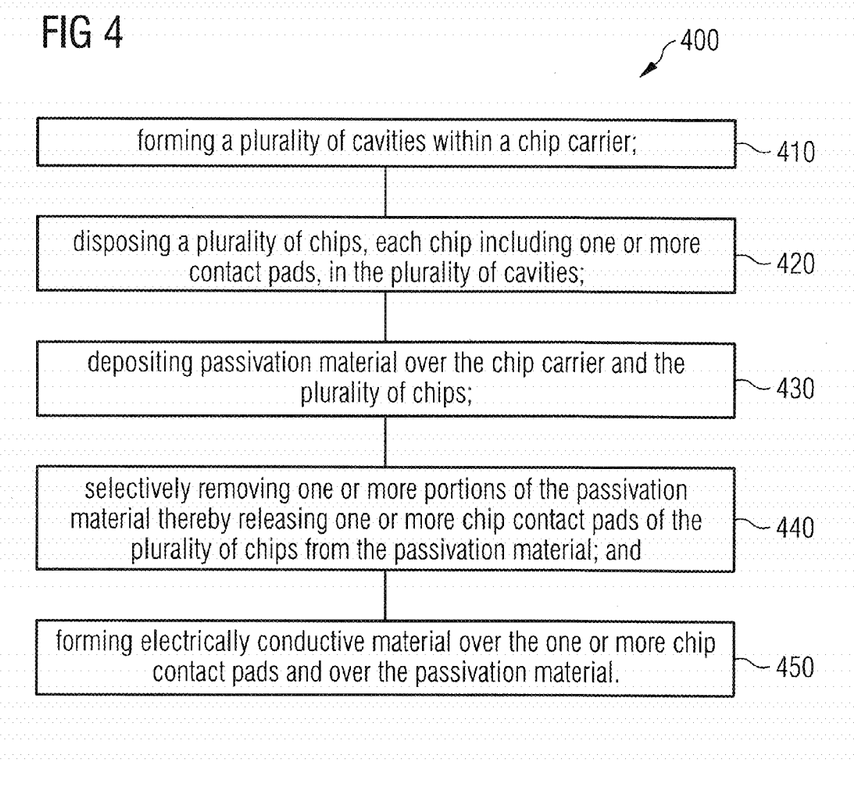
FIG. 4 shows a method for manufacturing a chip package according to an embodiment.

FIG. 4 shows method 400 for manufacturing a chip package according to an embodiment. Method 400 may include:

forming a plurality of cavities within a chip carrier (in 410);

disposing a plurality of chips, each chip including one or more contact pads, in the plurality of cavities (in 420);

depositing passivation material over the chip carrier and the plurality of chips (in 430);

selectively removing one or more portions of the passivation material thereby releasing one or more chip contact pads of the plurality of chips from the passivation material (in 440); and forming electrically conductive material over the one or more chip contact pads and over the passivation material (in 450).

Method 400 may include: forming plurality of cavities 208 within chip carrier 204, 206; disposing plurality of chips 218, each chip 218 including one or more contact pads 222, in plurality of cavities 208; depositing passivation material 224 over chip carrier 204, 206 and plurality of chips 218; selectively removing one or more portions 232 of passivation material 224 thereby releasing one or more chip contact pads 222 of plurality of chips 218 from the passivation material 224; and forming electrically conductive material 234 over one or more chip contact pads 222 and over passivation material 224.

Figure 5:
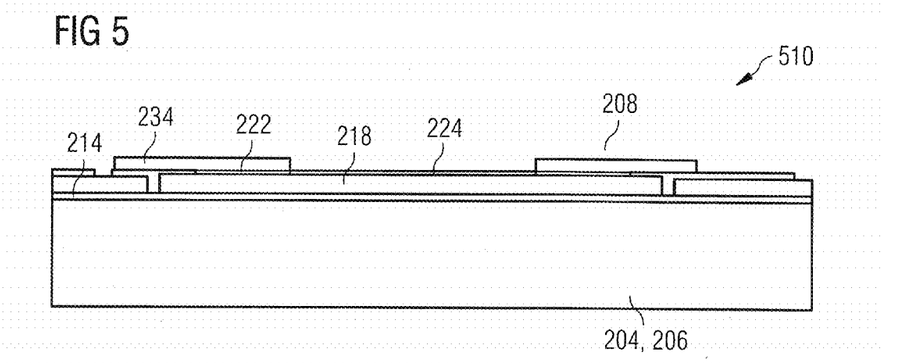
FIG. 5 shows a chip package according to an embodiment.

FIG. 5 shows chip package 510 according to an embodiment. Chip package 510 may include: chip carrier e.g. 204 and/or 206 including at least one cavity 208 formed within chip carrier, e.g. 204 and/or 206; at least one chip 218, including one or more contact pads 222, and disposed in the at least one cavity 208; passivation material 224 formed over chip carrier e.g. 204 and/or 206 and at least one chip 218, wherein one or more chip contact pads 222 of at least one chip 218 are released from passivation material 224; and electrically conductive material 234 formed over one or more chip contact pads 222, wherein electrically conductive material 234 is formed over the passivation material 224.

Figure 6:
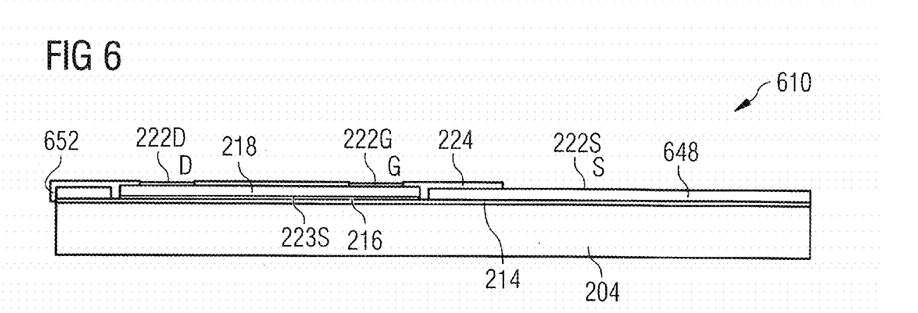
FIG. 6 shows a chip package according to an embodiment.

FIG. 6 shows chip package 610 according to an embodiment. Chip package 610 may include one or more or all of the features of chip packages 210, 510, except that chip package may not include any joining materials 246, e.g. solder balls, e.g. solder bumps etc. Chip package 610 may therefore provide a special low cost variation, wherein the RDL may be omitted, and possibly only the isolator, i.e. passivation material 224, may be applied, e.g. over carrier 204. Chip package 610 may be implemented particularly when the dimensions are small and the IC has solder pads.

Selected portions 648 of carrier 204 may be used as an electrical interconnect without the need for forming passivation materials, e.g. 224, e.g. 236, and further redistribution materials e.g. 234, e.g. 242, over selected portions 648 carrier 204. These selected portions 648 may for example include a source contact 222S. If chip 218 includes a power semiconductor chip, adhered side, e.g. back side, may include a source/drain contact 223S, instead of source/drain contact 222S formed over front side of chip 218. A further source/drain contact pad 222D may be formed on the front side of chip 218. A gate contact pad 222G may be formed on front side of chip 218. Back side source/drain contact 223S may be electrically connected to carrier 204 via layer 202 and adhesion layer 216. Therefore, a selected portion 648 of carrier 204 may be used as a direct electrical interconnect contact 222S to back side source/drain contact 223S. This may reduce costs because redistribution layers e.g. 234, e.g. 242, and passivation material e.g. 224, e.g. 236, may not be needed for forming a further joining structure interconnect 244, e.g. a solder ball, to the back side source/drain contact 223S. Redistribution layers e.g. 234, e.g. 242, and passivation material e.g. 224, e.g. 236, for the front side source/drain contact 222D and front side gate contact 222G, and joining structures 246 (not shown in FIG. 6) electrically connected to front side source/drain contact 222D and front side gate contact 222G may be formed as described according to previous embodiments. Passivation material 652 may be formed over one or more sidewalls of carrier 204 and/or further carrier material 206, wherein passivation material 652 may be used to enforce high voltage (HV) isolation. Chip package 610 may include a low cost, relatively small eWLB chip package for power applications.

It may be understood that according to various embodiments, each chip package, e.g. chip package 270, e.g. chip package 510, e.g. chip package 610, may not be limited to including only one chip. For example, a chip package according to an embodiment may include a half-bridge chip arrangement. Therefore, each chip package, after individualization, e.g. dicing, may include a plurality of, e.g. two, portions 212, of layer 202 released from further carrier material 206; plurality of chips 218, e.g. two chips, which may for example, be arranged in half-bridge arrangement, each chip 218 including one or more contact pads 222, e.g. 222S, e.g. 222D, wherein chips 218 may be adhered to carrier 204 via portions 212 of layer 202 released from further carrier material 206; wherein chips 218 are commonly held by layer 202.

Various embodiments provide a method for manufacturing a chip package and/or wafer level package which is reliable and 175° C. compatible, i.e. process compatible at 175° C. The chip package and wafer level package according to various embodiments may exhibit low thermal resistance. Various embodiments provide a method for manufacturing a chip package and/or wafer level package which is eWLB front end (FE) compatible. Various embodiments provide a method for manufacturing a chip package and/or wafer level package wherein an integrated circuit (IC) with a high current backside contact is provided.

Various embodiments provide a method for manufacturing a chip package, the method including: forming a layer over a carrier; forming further carrier material over the layer; selectively removing one or more portions of the further carrier material thereby releasing one or more portions of the layer from the further carrier material; adhering a chip including one or more contact pads to the carrier via the layer.

According to an embodiment, the carrier includes an electrically conductive sheet.

According to an embodiment, the carrier includes at least one material from the following group of materials, the group consisting of: copper, nickel, iron, silver, gold, palladium, copper alloy, nickel alloy, iron alloy, silver alloy, gold alloy, palladium alloy.

According to an embodiment, the carrier includes a thickness ranging from about 50 μm to about 1000 μm.

According to an embodiment, the layer includes an electrically conductive material including at least one material from the following group of materials, the group consisting of: silver, silver alloy, gold, gold alloy, nickel, palladium.

According to an embodiment, forming a layer over the carrier includes forming the layer over the carrier by at least one method from the following group of methods, the group of methods consisting of: electroplating, electroless plating, galvanic deposition, lamination, foil lamination, sputtering, evaporation, chemical vapor deposition, plasma enhanced chemical vapor deposition, printing.

According to an embodiment, forming a layer over the carrier includes forming an electrically conductive layer including at least one of an electrically conductive glue and an electrically conductive nanopaste.

According to an embodiment, forming a layer over the carrier includes forming an electrically conductive layer over the carrier and a sintering layer over the electrically conductive layer.

According to an embodiment, forming a layer over the carrier includes forming at least one of an electrically conductive layer and an electrically insulating layer over the carrier.

According to an embodiment, the electrically insulating layer includes an electrically insulating adhesive including at least one from the following group of materials, the group consisting of: polyimide, benzocyclobuten, epoxy.

According to an embodiment, the further carrier material includes a thickness ranging from about 60 μm to about 200 μm.

According to an embodiment, the further carrier material includes the same material as the carrier.

According to an embodiment, forming further carrier material over the layer includes forming further carrier material over the layer by at least one method from the following group of methods, the group of methods consisting of: lamination, sintering, gluing.

According to an embodiment, forming a layer over a carrier and forming further carrier material over the layer includes adhering a foil including the layer and further carrier material to the carrier.

According to an embodiment, selectively removing one or more portions of the further carrier material thereby releasing one or more portions of the layer from the further carrier material includes selectively etching one or more portions of the further carrier material wherein the layer functions as an etch stop layer.

According to an embodiment, selectively removing one or more portions of the further carrier material thereby releasing one or more portions of the layer from the further carrier material includes selectively etching one or more portions of the further carrier material wherein the layer prevents etching of the carrier.

According to an embodiment, selectively removing one or more portions of the further carrier material thereby releasing one or more portions of the layer from the further carrier material includes selectively removing one or more portions of the further carrier material by at least one method from the following group of methods, the group of methods consisting of: chemical etching, plasma etching, sandblasting.

According to an embodiment, the one or more portions of the layer released from the further carrier material are commonly joined by further portions of the layer covered by the further carrier material.

According to an embodiment, adhering a chip including one or more contact pads to the carrier via the layer includes adhering the chip including one or more contact pads to the carrier via one or more portions of the layer released from the further carrier material.

According to an embodiment, the method further includes forming an adhesion layer over the one or more portions of the layer released from the further carrier material, and adhering the chip to the carrier via the adhesion layer.

According to an embodiment, the adhesion layer includes an electrically conductive material including at least one material from the following group of materials, the group consisting of: an electrically conductive glue, an electrically conductive adhesive, an electrically conductive polymer, an electrically conductive organic polymer, an electrically conductive epoxy.

According to an embodiment, the adhesion layer includes an electrically insulating material including at least one material from the following group of materials, the group consisting of: a polymer, an organic polymer, epoxy.

According to an embodiment, the adhesion layer includes at least one of an electrically conductive glue and an electrically conductive nanopaste.

According to an embodiment, the adhesion layer includes a thickness ranging from about 3 μm to about 70 μm.

According to an embodiment, the method further includes depositing passivation material over the carrier and the chip; and selectively removing one or more portions of the passivation material thereby releasing the one or more contact pads from the passivation material.

According to an embodiment, the method further includes depositing passivation material over the layer.

According to an embodiment, the method further includes forming electrically conductive material over the passivation material and over the one or more contact pads.

According to an embodiment, the method further includes individualizing a chip package by separating through the carrier, the further carrier material and the layer.

According to an embodiment, forming a layer over the carrier includes forming an electrically insulating layer over the carrier; and the method further includes selectively removing one or more portions of at least one of the carrier and the further carrier material, wherein at least one of the carrier and the further carrier material includes an electrically conductive redistribution layer.

Various embodiments provide a chip package, including: a carrier; a layer formed over the carrier; further carrier material formed over the layer; one or more portions of the layer released from the further carrier material; a chip including one or more contact pads, wherein the chip is adhered to the carrier via the layer.

Various embodiments provide a method for manufacturing a wafer level package, the method including forming a layer over a carrier; forming further carrier material over the layer; selectively removing a plurality of portions of the further carrier material thereby releasing a plurality of portions of the layer from the further carrier material; adhering a plurality of chips including one or more contact pads to the carrier via the plurality of portions of the layer released from the further carrier material; wherein the plurality of chips are commonly held by the layer.

Various embodiments provide a wafer level package including a carrier; a layer formed over the carrier; further carrier material formed over the layer; a plurality of portions of the layer released from the further carrier material; a plurality of chips each including one or more contact pads, wherein the plurality of chips are adhered to the carrier via the plurality of portions of the layer released from the further carrier material; wherein the plurality of chips are commonly held by the layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
  a carrier;
  a layer over the carrier, the layer comprising an electrically insulating layer; and
  a further carrier material over the layer, the further carrier material comprising a foil, wherein one or more portions of the further carrier material is removed, thereby releasing one or more portions of the layer from the further carrier material; and
  a chip comprising one or more contact pads, wherein the chip is adhered to the carrier via the layer,
  wherein the carrier comprises a thickness ranging from about 50 µm to about 1000 µm.

2. The chip package according to claim 1,
  wherein the carrier comprises an electrically conductive sheet.

3. The chip package according to claim 1,
  wherein the carrier comprises at least one material from the following group of materials, the group consisting of: copper, nickel, iron, silver, gold, palladium, copper alloy, nickel alloy, iron alloy, silver alloy, gold alloy, palladium alloy.

4. The chip package according to claim 1,
  wherein the layer comprises an electrically conductive material comprising at least one material from the group consisting of: silver, silver alloy, gold, gold alloy, nickel, and palladium.

5. The chip package according to claim 1,
  wherein the layer has a substantially uniform thickness.

6. The chip package according to claim 1,
  wherein the layer comprises an electrically conductive layer comprising at least one of an electrically conductive glue and an electrically conductive nanopaste.

7. The chip package according to claim 1,
  wherein the layer comprises an electrically conductive layer over the carrier and a sintering layer over the electrically conductive layer.

8. The chip package according to claim 1,
  wherein the layer comprises an electrically conductive layer.

9. The chip package according to claim 1,
  wherein the electrically insulating layer comprises an electrically insulating adhesive comprising at least one from the group consisting of: polyimide, benzocyclobutene, and epoxy.

10. The chip package according to claim 1,
  wherein the further carrier material comprises a thickness ranging from about 60 µm to about 200 µm.

11. The chip package according to claim 1,
  wherein the further carrier material comprises the same material as the carrier.

12. The chip package according to claim 1,
  wherein the layer is configured as an etch stop layer during
  removal of one or more portions of the further carrier material, thereby releasing one or more portions of the layer from the further carrier material.

13. The chip package according to claim 1,
  wherein the layer is configured to prevent etching of the carrier during
  removal of one or more portions of the further carrier material, thereby releasing one or more portions of the layer from the further carrier material.

14. The chip package according to claim 1,
  wherein the one or more portions of the layer released from the further carrier material are commonly joined by further portions of the layer covered by the further carrier material.

15. A chip package, comprising:
  a carrier;
  a layer over a carrier, wherein the layer comprises an electrically insulating layer; and
  a further carrier material over the layer, wherein one or more portions of the further carrier material is removed, thereby releasing one or more portions of the layer from the further carrier material;
  a chip comprising one or more contact pads, wherein the chip is adhered to the carrier via the layer; and
  a passivation material deposited over the carrier and the chip, wherein one or more portions of the passivation material is removed, thereby releasing the one or more contact pads from the passivation material.

16. The chip package of claim 15, further comprising
  an electrically conductive material over the passivation material and over the one or more contact pads.

17. A wafer level package comprising
  a carrier;
  a layer over the carrier, wherein the layer comprises an electrically insulating layer;
  a further carrier material over the layer, the further carrier layer comprising a foil,
  wherein a plurality of portions of the further carrier material are removed, thereby releasing a plurality of portions of the layer from the further carrier material; and
  a plurality of chips each comprising one or more contact pads, wherein the plurality of chips are adhered to the carrier via the plurality of portions of the layer released from the further carrier material;
  wherein the plurality of chips are commonly held by the layer,
  wherein the carrier comprises a thickness ranging from about 50 µm to about 1000 µm.

18. The chip package of claim 1, wherein the chip package is a final structure.

19. The wafer level package of claim 17, wherein the wafer level package is a final structure.

20. The wafer level package of claim 17, wherein the further carrier material comprises a thickness ranging from about 60 µm to about 200 µm.

* * * * *